(12) United States Patent
Badger et al.

(10) Patent No.: US 8,432,212 B2
(45) Date of Patent: Apr. 30, 2013

(54) SWITCHING ELEMENT HAVING AN ELECTROMECHANICAL SWITCH AND METHODS FOR MAKING AND USING SAME

(75) Inventors: David A. Badger, Lago Vista, TX (US); Joseph F. Pinkerton, Austin, TX (US)

(73) Assignee: Clean Energy Labs, LLC, Austin, TX (US)

( * ) Notice: Subject to any disclaimer, the term of this patent is extended or adjusted under 35 U.S.C. 154(b) by 152 days.

(21) Appl. No.: 13/097,513

(22) Filed: Apr. 29, 2011

(65) Prior Publication Data
US 2012/0274388 A1  Nov. 1, 2012

(51) Int. Cl.
*H03K 17/00* (2006.01)
*H02M 3/156* (2006.01)

(52) U.S. Cl.
USPC ........... 327/403; 327/108; 327/419; 327/479; 323/223; 323/225; 323/282; 323/350; 323/351; 363/50; 363/53

(58) Field of Classification Search ......... 327/108–112, 327/403–405, 419, 478, 531, 532; 323/223–225, 323/265, 268, 269, 271, 272, 282–285, 349–351; 363/15, 16, 50, 52, 53, 55, 56.01
See application file for complete search history.

(56) References Cited

U.S. PATENT DOCUMENTS

| | | | | |
|---|---|---|---|---|
| 5,943,223 | A * | 8/1999 | Pond | 363/53 |
| 6,188,209 | B1 * | 2/2001 | Poon et al. | 323/255 |
| 7,148,662 | B2 * | 12/2006 | Kato | 323/222 |
| 7,417,409 | B2 * | 8/2008 | Partridge | 323/222 |
| 7,940,034 | B2 * | 5/2011 | Pelz et al. | 323/284 |
| 2006/0220626 | A1 | 10/2006 | Partridge | |

* cited by examiner

*Primary Examiner* — Patrick O'Neill
(74) *Attorney, Agent, or Firm* — Greenberg Traurig, LLP

(57) ABSTRACT

A switching element having an electromechanical switch (such as an electrically conductive membrane switch, for example a graphene membrane switch) is disclosed herein. Such a switching element can be made and used in a switching power converter to reduce power loss and to maximize efficiency of the switching power converter.

44 Claims, 9 Drawing Sheets

SWITCHING ELEMENT HAVING AN ELECTROMECHANICAL SWITCH AND METHODS FOR MAKING AND USING SAME

TECHNICAL FIELD

The present invention relates to a switching element for use in switching power converters and methods to maximize their efficiency. The switching element has an electromechanical switch (such as an electrically conductive membrane switch, for example, a graphene membrane switch). Such a switching element can be made and used to reduce power loss and maximize efficiency of the switching power converter.

BACKGROUND

Switching power converters are well known in the art and are typically used to convert AC power to DC power, to convert DC power to AC power, or to convert one DC voltage level to another. Power converters are used in electronic equipment to control the power that is delivered to variety of loads. These converters typically use semiconductor based switching elements that are cycled via Pulse Width Modulation (PWM). For example, when used to convert DC power to AC power, PWM alters the width of the conduction waveform of the switching device such that the output voltage will oscillate back and forth between a positive peak voltage to a negative peak voltage.

A simple single-phase power converter is shown in FIG. 1. It is composed of a DC source 101, switching elements 102 and 103, an inductor/capacitor filter 104 (having inductor 105 and capacitor 106), and an AC load 107. Generally, the switching elements 102 and 103 are operated at a PWM frequency well above the corner of the inductor/capacitor filter 104 with a varying duty cycle in order to achieve the desired AC voltage at the load 107.

In various applications, the switching elements 102 and 103 are each a semiconductor switch. A semiconductor switch is a switch that includes a semiconductor material such as silicon, silicon carbide and gallium nitride (which are referred to as silicon-based switches, silicon-carbide-based switches and gallium-nitride-based switches, respectively. Examples of semiconductor switches include insulated gate bipolar transistor (IGBT) switches and metal-oxide-semiconductor field-effect transistor (MOSFET) switch), which can be made of silicon, silicon carbide, gallium nitride, a combination thereof, or other semiconductor material (or materials).

An example of a semiconductor switch is an insulated gate bipolar transistor (IGBT) and a diode in parallel. A configuration of an IGBT switch 200 is shown in FIG. 2. The IGBT switch 200 includes an IGBT 201 and a diode 202. IGBTs are often selected for their ability to switch high voltages and currents and for their relatively low on-state voltage (compared with other silicon-based switches). An IGBT is a three-terminal power semiconductor device (a gate (G), a collector (C), and an emitter (E). IGBTs switch electric power in many modern appliances: electric cars, trains, variable speed refrigerators, air-conditioners and even stereo systems with switching amplifiers.

The converter design is significantly impacted by the power losses that result from the use of semiconductor devices. Cooling and waste heat removal are a major size, weight, and cost adder for any given power capacity.

Switching power converting losses generally arise from conduction loss and switching loss. Conduction losses are the normal losses of the switching device while conducting current when running in a saturated condition. Switching losses are the losses associated with the actions of turning active switching devices on and off. Switching losses occur when there is simultaneously, high voltage across the device and current through it during transitions between on and off. Because switching losses are incurred every time the device turns on and off, higher device frequencies result in greater switching losses.

As shown in FIG. 3, IGBTs suffer from high switching losses due to a high voltage-current product during turn-on stage 303 and turn-off stage 304. FIG. 3 shows the typical IGBT voltage and current characteristics in curves 301 and 302, respectively. The switched losses are somewhat worse during the turn-off stage due to the IGBT current tail 305. Another problem with current IGBT devices is that there are conduction power losses due to the on-state voltage that persists while the device is carrying current, which is effectively manifests itself as an on-state resistance.

Further discussion of losses in switching power converters is described in U.S. Patent Appl. Publ. No. 2006/0220626, (Partridge).

A need thus exists for improved switching elements to reduce the losses that occur in switching power converters and to improve the efficiency of switching power converters.

SUMMARY OF THE INVENTION

The present invention relates to a switching element having an electromechanical switch (such as an electrically conductive membrane switch, for example, a graphene membrane switch). In one embodiment of the present invention, the switching element utilizes a hybrid combination of an electromechanical switch (an electrically conductive membrane switch, such as a graphene membrane switch) and a semiconductor switch. In another embodiment of the present invention, the switching element utilizes two different types of electromechanical switches (two electrically conductive membrane switches, such as two graphene membrane switches). For instance, one electromechanical switch can be a graphene membrane switch optimized for high voltage switching and the other electromechanical switch can be a graphene switch optimized for low conduction losses.

In general, in one aspect, the invention features a switching element that includes a first switch, a second switch, and a controller. The second switch includes an electromechanical switch that is connected electrically in parallel with the first switch. The controller is operatively connected to the first switch and the second switch. The controller is operable for turning on the first switch at a first voltage. The controller is operable for turning on the second switch at a second voltage after a first time delay such that the second switch is turned on after the first switch is turned on by the controller. The second voltage is less than the first voltage.

Implementations of the inventions can include one or more of the following features:

The controller can be operable for turning off the first switch after a second time delay such that the first switch is turned off after the second switch is turned on by the controller. The controller can be operable for turning off the second switch after a third time delay such that the second switch is turned off after the first switch is turned off by the controller.

The second switch can be an electrically conductive membrane switch.

The controller can be operable for synchronizing the operation of the first switch and the second switch.

The second switch can be an electrically conductive membrane switch having an electrically conductive membrane that is atomically thin.

The electrically conductive membrane can be graphene.

The first switch can be a semiconductor switch.

The first switch can be a silicon-based switch.

The first switch can be an insulated gate bipolar transistor switch.

The first switch can be a metal-oxide-semiconductor field-effect transistor switch.

The first switch can be a silicon-carbide-based switch.

The first switch can be a gallium-nitride-based switch.

The first switch can be an electrically conductive membrane.

The first switch can be an electrically conductive membrane switch that includes graphene.

The second switch can be a graphene membrane switch.

The first switch can be a graphene membrane switch.

The switching element can further include a third switch. The third switch can be connected electrically with the first switch and the second switch. The first switch, the second switch, and the third switch can be connected in parallel. The controller can be operatively connected to the third switch such that the controller is operable for controlling the third switch.

The controller can be operable for turning on the third switch after the first switch and the second switch are turned on by the controller. The controller can be operable for turning off the third switch after the first switch and the second switch are turned off by the controller.

The second switch can be a nano electromechanical switch.

In general, in another aspect, the invention features a switching element that includes a first switch, a second switch, and a controller. The second switch is an electrically conductive membrane switch operatively connected electrically in parallel with the first switch. The controller is operatively connected to the first switch and the second switch such that the controller is operable for controlling the first switch and the second switch.

Implementations of the above inventions can include one or more of the following features:

The electrically conductive membrane switch can include a graphene membrane switch, a graphene oxide membrane switch, or a graphene/graphene oxide membrane switch.

The electrically conductive membrane switch can include a graphene membrane.

In general, in another aspect, the invention features a switching power converter that includes a first switching element, a second switching element, a power source, a filter, and a load. The second switching element includes an electromechanical switch, a parallel switch, and a controller. The parallel switch is connected electrically in parallel to the electromechanical switch. The controller is operable for (a) turning on the parallel switch at a first voltage, (b) turning on the electromechanical switch at a second voltage after a first time delay such that the electromechanical switch is turned on after the parallel switch is turned on by the controller, (c) turning off the parallel switch after a second time delay such that the parallel switch is turned off after the electromechanical switch is turned on by the controller; and (d) turning off the electromechanical switch after a third time delay such that the electromechanical switch is turned off after the parallel switch is turned off by the controller. The second voltage is less than the first voltage. The first switching element, second switching element, the power source, the filter, and the load are operatively connected for switching power converting operations.

Implementations of the above inventions can include one or more of the following features:

The second switch can include an electrically conductive membrane switch.

The second switch can be a graphene membrane switch.

The parallel switch can include a different electrically conductive membrane switch.

The parallel switch can be a different graphene membrane switch.

The parallel switch can include a semiconductor switch. The semiconductor switch can be a silicon-based switch.

The parallel switch can include an insulated gate bipolar transistor switch.

The switching power converter can be operable for converting AC power to DC power, converting DC power to AC power, converting one DC voltage level to another DC voltage level, or combinations thereof.

The controller can be operable for cycling the first switching element and the second switching element via pulse width modulation.

In general, in another aspect, the invention features a method of operating a switching element that includes turning on a first switch at a first voltage and turning on a second switch at a second voltage after a time delay. The second switch includes an electromechanical switch. The second switch is turned on after the first switch is turned on. The second voltage is less than the first voltage.

Implementations of the above inventions can include one or more of the following features:

The method can further include turning off said first switch after a second time delay such that the first switch is turned off after the second switch is turned on, and turning off the second switch after a third time delay such that the second switch is turned off after the first switch is turned off.

The electromechanical switch can be an electrically conductive membrane switch.

The electromechanical switch can be an electrically conductive membrane switch having an electrically conductive membrane that is atomically thin.

The electrically conductive membrane switch can include graphene.

The first switch can include a semiconductor material.

The first switch can include silicon.

The first switch can be an insulated gate bipolar transistor switch.

The first switch can be a metal-oxide-semiconductor field-effect transistor switch.

The first switch can include silicon carbide.

The first switch can include of gallium nitride.

The first switch can be a different electromechanical switch.

The first switch can be a different electrically conductive membrane switch.

The first switch can be a different electrically conductive membrane switch that includes graphene.

The second switch can be a graphene membrane switch.

The first switch can be a graphene membrane switch.

In general, in another aspect, the invention features a method of operating a switching power convertor. The method includes operating a first switching element an operating a second switching element. Operating the second switching element includes turning on a first switch at a first voltage and turning on a second switch at a second voltage after a time delay. The second switch is connected electrically in parallel to the first switch. The second switch includes an electromechanical switch. The second voltage is less than the first voltage. The switching power converter coverts AC power to DC power, converts DC power to AC power, converts one DC voltage level to another DC voltage level, or combinations thereof.

Implementations of the above inventions can include one or more of the following features:

The second switch can include an electrically conductive membrane switch.

The electronically conductive membrane switch can be a graphene membrane switch.

The second switching element can further include a controller that controls the operation of the electrically conductive membrane switch and the first switch.

The first switch can include a different electromechanical switch.

The first switch can include a different electrically conductive membrane switch.

The second switch can be a graphene membrane switch.

The first switch can be a different graphene membrane switch.

The first switch can be a semiconductor switch.

The first switch can be a silicon-based switch

The first switch can be an insulated gate bipolar transistor switch.

The method can further include cycling the first switching element and the second switching element via pulse width modulation.

DETAILED DESCRIPTION

The present invention relates to a switching element having an electromechanical switch (such as an electrically conductive membrane switch, for examples a graphene membrane switch). Such switching elements can be made and used in a switching power converter to reduce power loss and to maximize efficiency of the switching power converter.

Graphene membranes (also otherwise referred to as "graphene drums") have been manufactured using process such as disclosed in Lee et al. Science, 2008, 321, 385-388. PCT Patent Appl. No. PCT/US09/59266, (Pinkerton) (the "PCT US09/59266, Application") described tunneling current switch assemblies having graphene drums (which graphene drums generally having a diameter between about 500, nm and about 1500, nm). U.S. Patent Appl. Nos. 61/391, 727 (Pinkerton et al.) and 61/427,011, (Everett et al.) further describe switch assemblies having graphene drums. A switch that includes a graphene membrane is a graphene membrane switch.

Alternatively, other types of electrically conductive membranes (also referred to as "electrically conductive drums") may be utilized in lieu of graphene membranes in embodiments of the present invention, such as, for example, graphene oxide membranes. A switch that includes a graphene oxide membrane is a graphene oxide membrane switch. A switch that includes a graphene/graphene oxide membrane is a graphene/graphene oxide membrane switch.

Such electrically conductive membranes are types of electromechanical switches that can be used in an embodiment of the present invention. Other types of electromechanical switches can be used in embodiments of the present invention, such as, for example, micro-electromechanical system (MEMS) switches.

Figure 2:
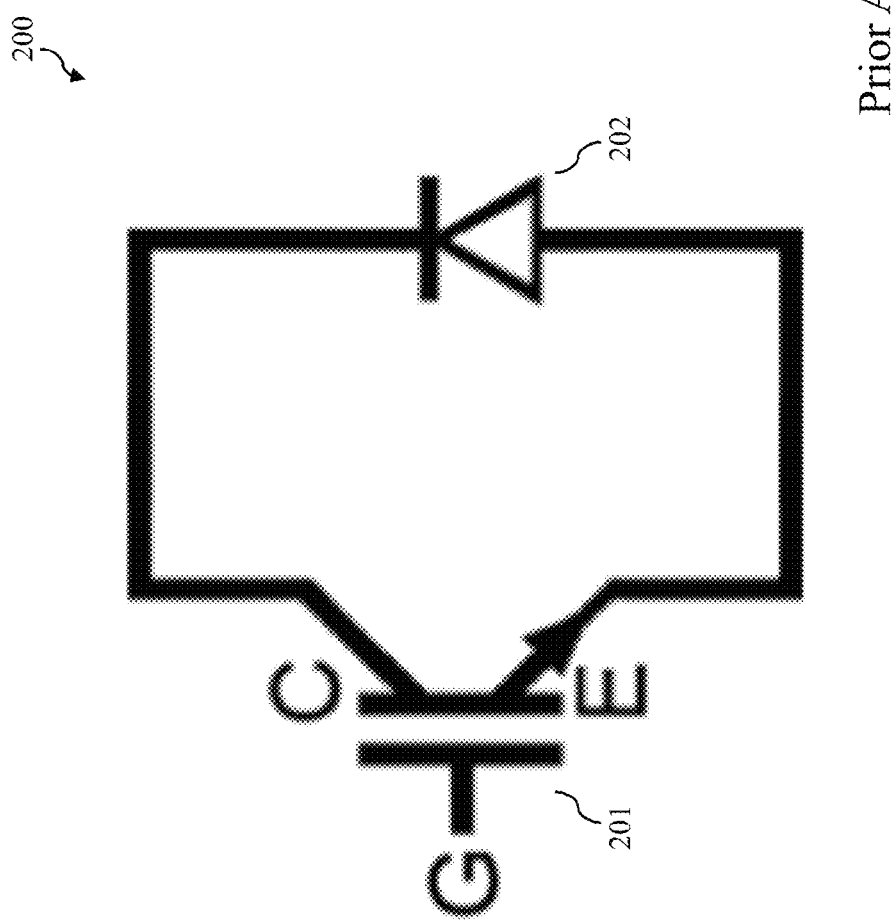
FIG. 2 depicts an IGBT switch that can be used as a switching element shown in FIG. 1.
Figure 3:
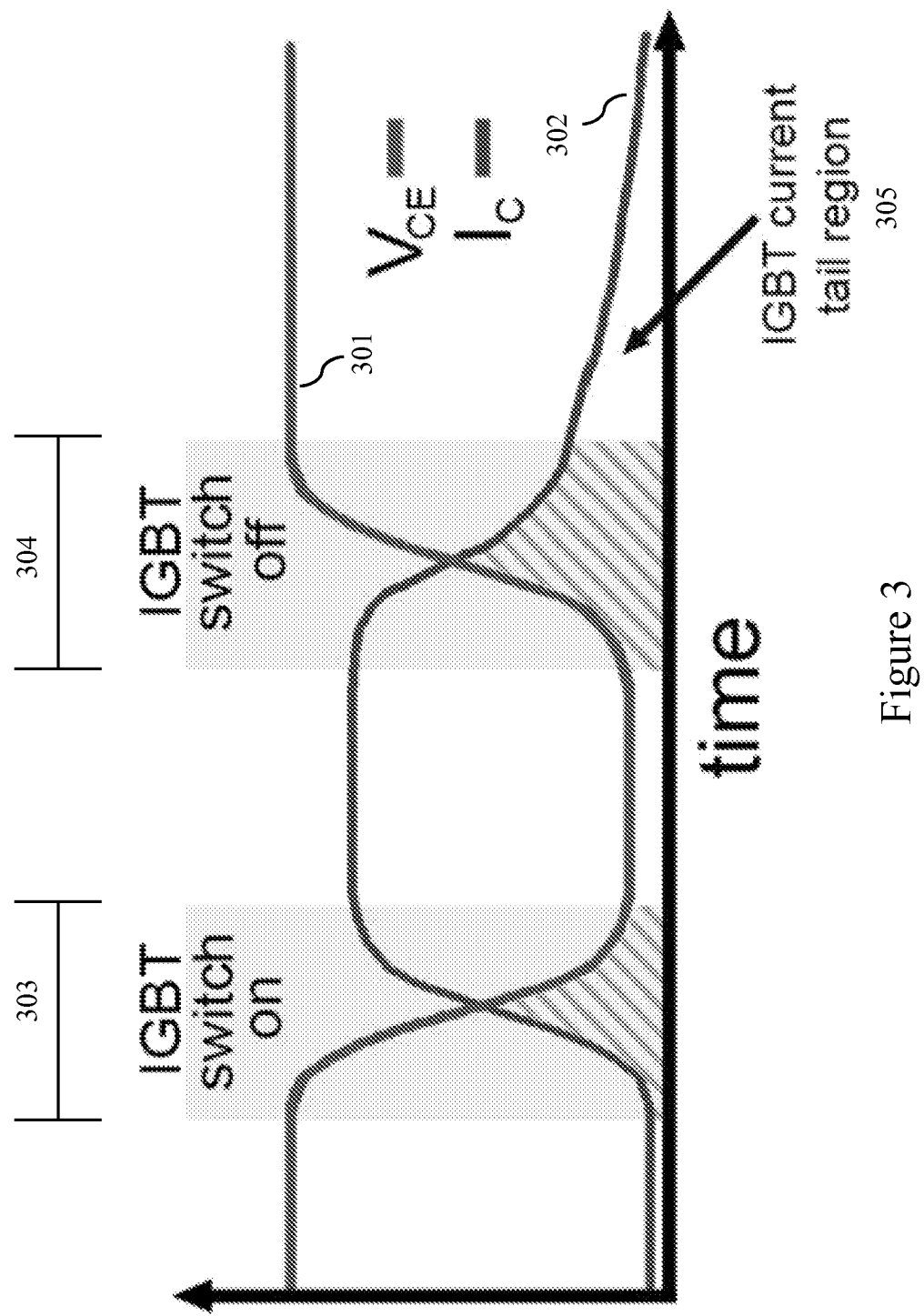
FIG. 3 is a graph showing typical IGBT voltage and current characteristics in a standard power converter configuration.

As discussed above, in various applications, the switching element of a standard switching power converter is generally composed of an IGBT switch (such as the IGBT switch 200 shown in FIG. 2).

One or more electromechanical switches (such as electrically conductive membrane switches, for example graphene membrane switches) can be connected in parallel with an IGBT and diode, and any combination or subset of the devices can be used to achieve the desired performance characteristics. The switching power converter can utilize a switching element having an IGBT/electromechanical switch configuration, such as shown in the IGBT/electromechanical switch hybrid switching element 400 shown in FIG. 4. The IGBT/electrically conductive membrane hybrid switching element 400 includes an IGBT switch (which includes the IGBT 401 and a diode 402), and an electromechanical switch (electrically conductive membrane switch 403).

Figure 5:
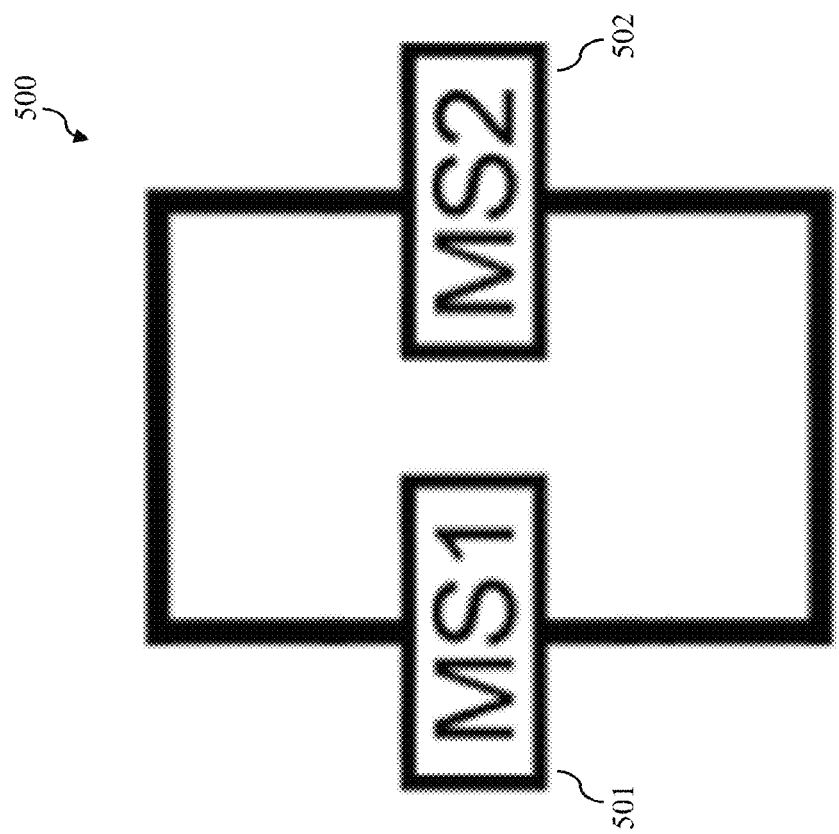
FIG. 5 depicts a parallel electromechanical switch configuration that can be used in an embodiment of the present invention.

The switching power converter can also (or instead) utilize a switching element having a parallel electromechanical switch configuration, such as shown in the parallel electromechanical switching element 500 shown in FIG. 5. The parallel electromechanical switching element 500 includes two electromechanical switches (electrically conductive membrane switches 501 and 502). For instance, in a parallel electromechanical switching element 500, electrically conductive membrane switch 501 can be a graphene membrane switch optimized for high voltage switching and electrically conductive membrane switch 502 can be a graphene switch optimized for low conduction losses.

Unlike silicon-based devices, the graphene membrane is fully bi-directional, so with the appropriate feedback control scheme, the graphene membrane switch can also serve as the diode in the circuit, therefore making it possible to eliminate the need for both the IGBT and the diode.

Figure 1:
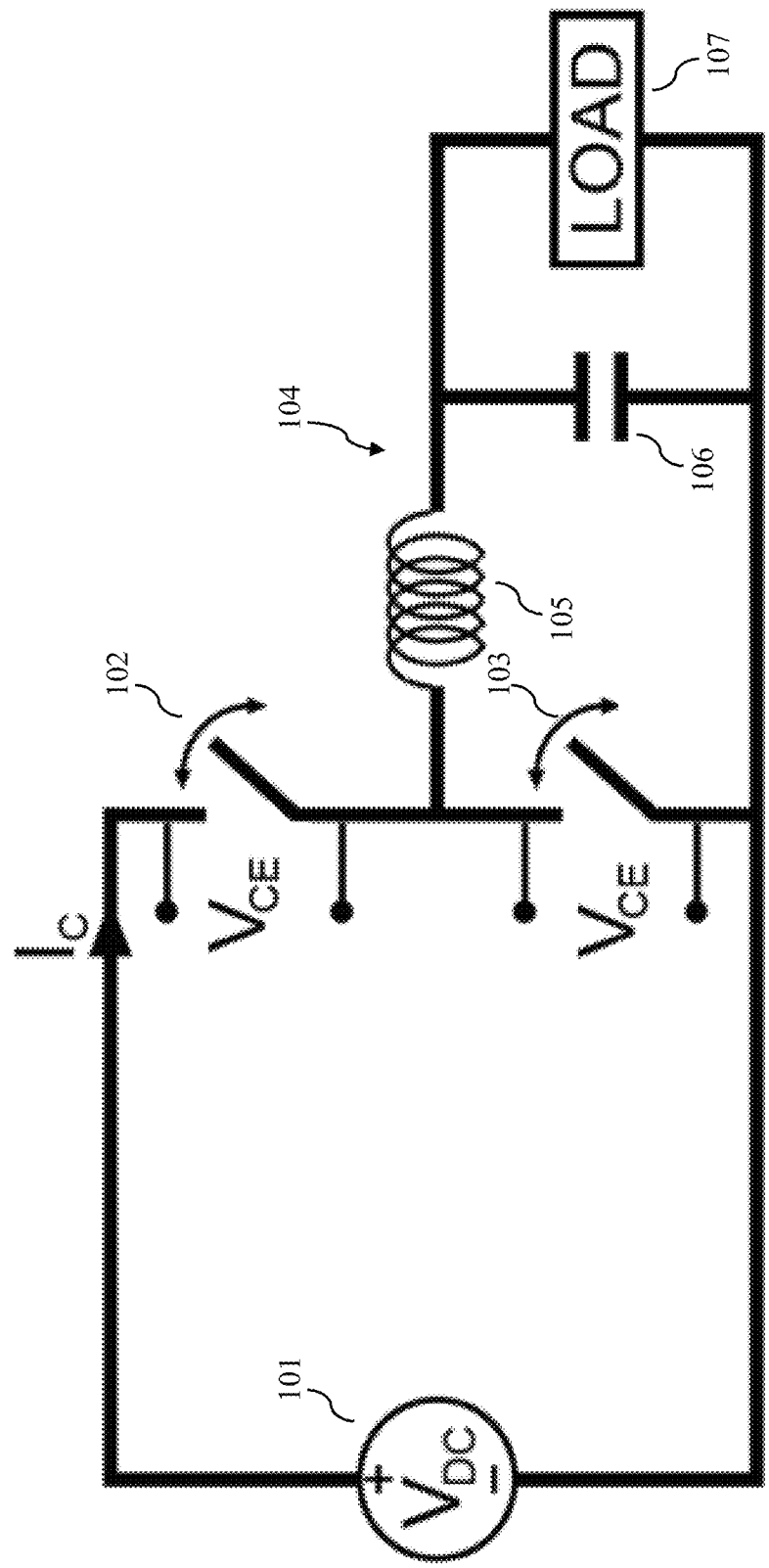
FIG. 1 depicts a standard power converter configuration.

In embodiments of the present invention, at least one of switching elements 102 and 103 (as shown in FIG. 1) includes an electromechanical switch, such as an electrically conductive membrane switch (for example, at least one of switching elements 102 and 103 can be an IGBT/electromechanical hybrid switching element 400 or a parallel electromechanical switching element 500). The other of switching elements 102 or 103 can also include an electromechanical switch (for example, the other of switching elements 102 and 103 can be an IGBT/electromechanical hybrid switching element 400 or a parallel electromechanical switching element 500) or can be a switching element that does not have an electrically conductive membrane (for example, a semiconductor switch, such as an IGBT switch 200 or a MOSFET switch).

In such embodiments of the present invention, the electromechanical switch of the switching element can be an electrically conductive switch (such as a graphene membrane switch) constructed with the capability of switching at the same high voltage level as the IGBT, but with lower switching losses.

In such embodiments of the present invention, the electromechanical switch of the switching element can be an electrically conductive membrane switch (such as a graphene membrane switch) constructed such that it is not capable of switching the full voltage of the IGBT, but has a lower on-state resistance than the IGBT once it is on.

Figure 4:
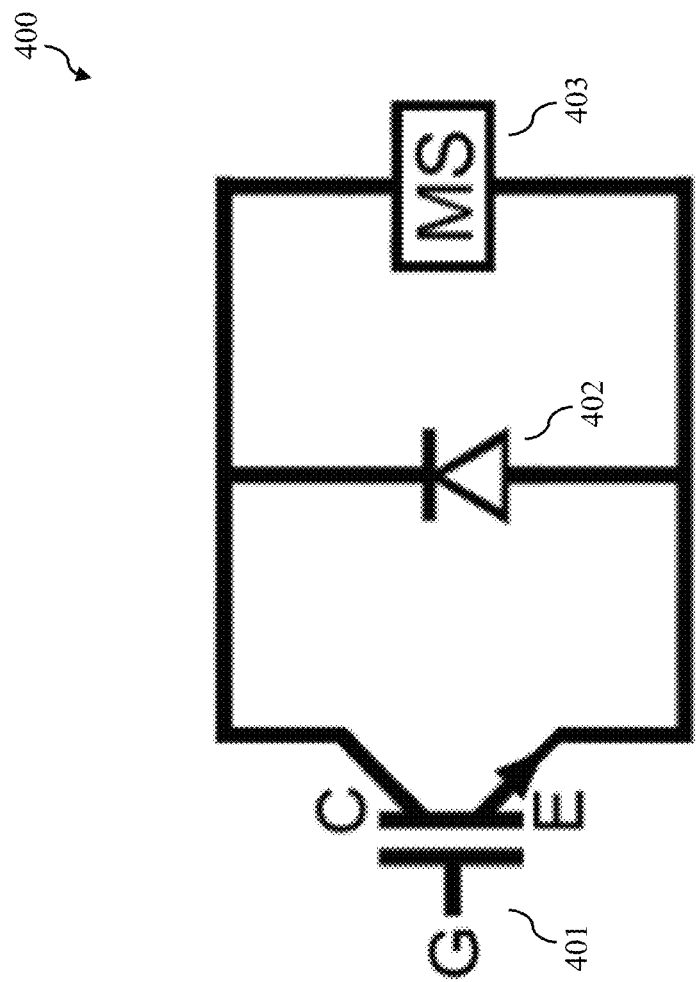
FIG. 4 depicts an IGBT/electromechanical hybrid switch configuration that can be used in an embodiment of the present invention.

By combining the different semiconductor switches and electromechanical switches (such as shown in FIGS. 2, 4, and 5) and controlling the switch timing, improved overall efficiency can be achieved.

Figure 6:
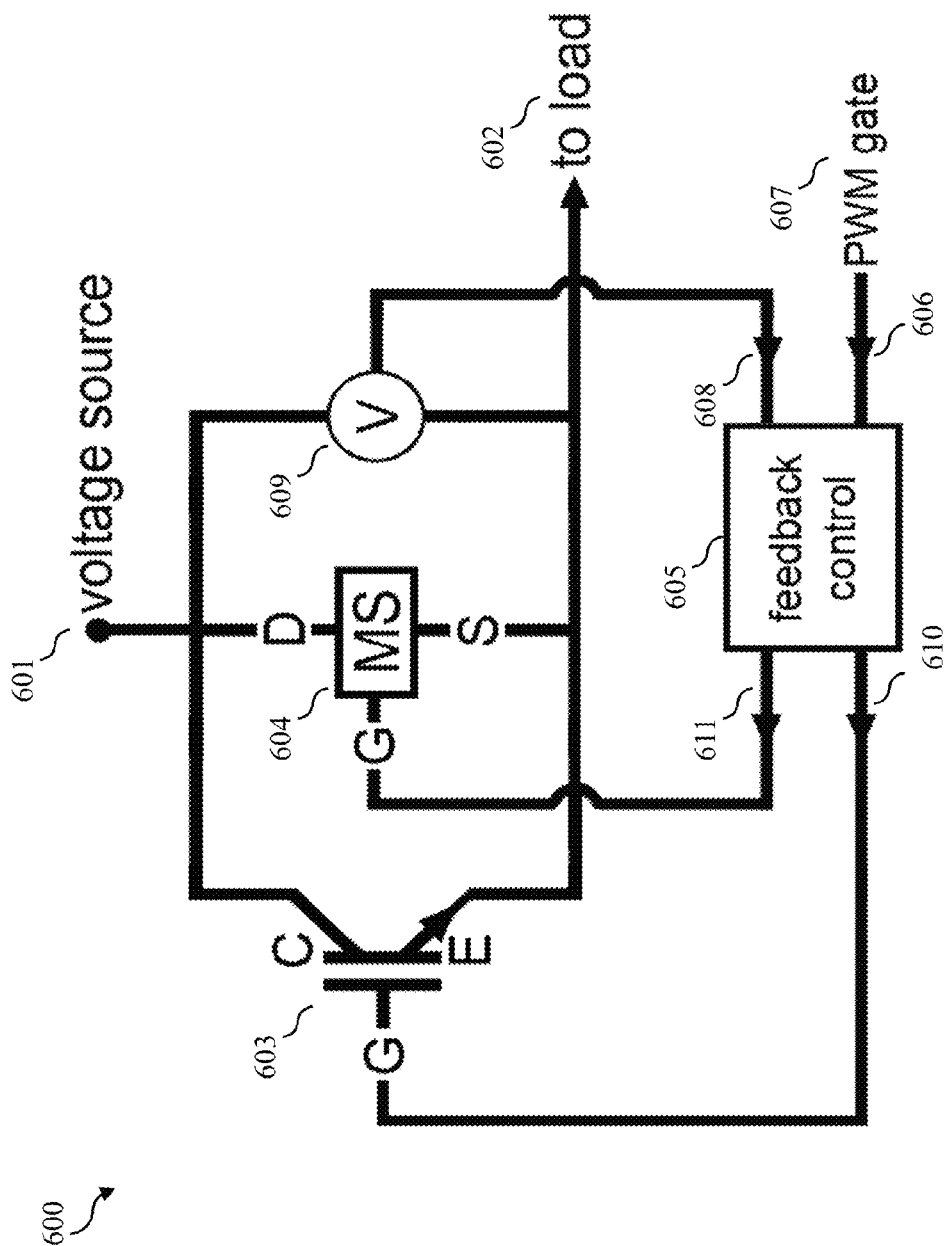
FIG. 6 depicts an embodiment of the present invention that utilizes an IGBT/electromechanical hybrid switch configuration.

FIG. 6 depicts an embodiment of the present invention that utilizes an IGBT/electromechanical hybrid switch configuration depicts a switching element 600 that can be connected to voltage at voltage source 601 and that can be connected to the load at load 602. Switching element 600 includes two switches, namely an IGBT switch 603 (which is "device 1" in depicted switching element 600) and an electromechanical switch (an electrically conductive membrane switch 604, which is "device 2" in depicted switching element 600). Switching element 600 further includes a controller 605 (i.e., a feedback control) that has as inputs: (a) an input 606 from a PWM gate 607, and (b) an input 608 from a voltage feedback sensor 607 for measuring the voltage across IGBT switch 603 and electrically conductive membrane switch 604. The controller 605 has as outputs: (a) an output 610 to the gate control of the IGBT switch 603, and (b) an output 611 to the gate control of the electrically conductive membrane switch 604, so that each device (IGBT switch 603 and electrically conductive membrane switch 604) can be switched on and off independently at the appropriate times. In an embodiment of the present invention, controller 605 can be as simple as an array of resistors and capacitors that will passively turn on IGBT switch 603 and then turn on electrically conductive membrane switch 604 after a time delay.

Figures 7A, 7B:
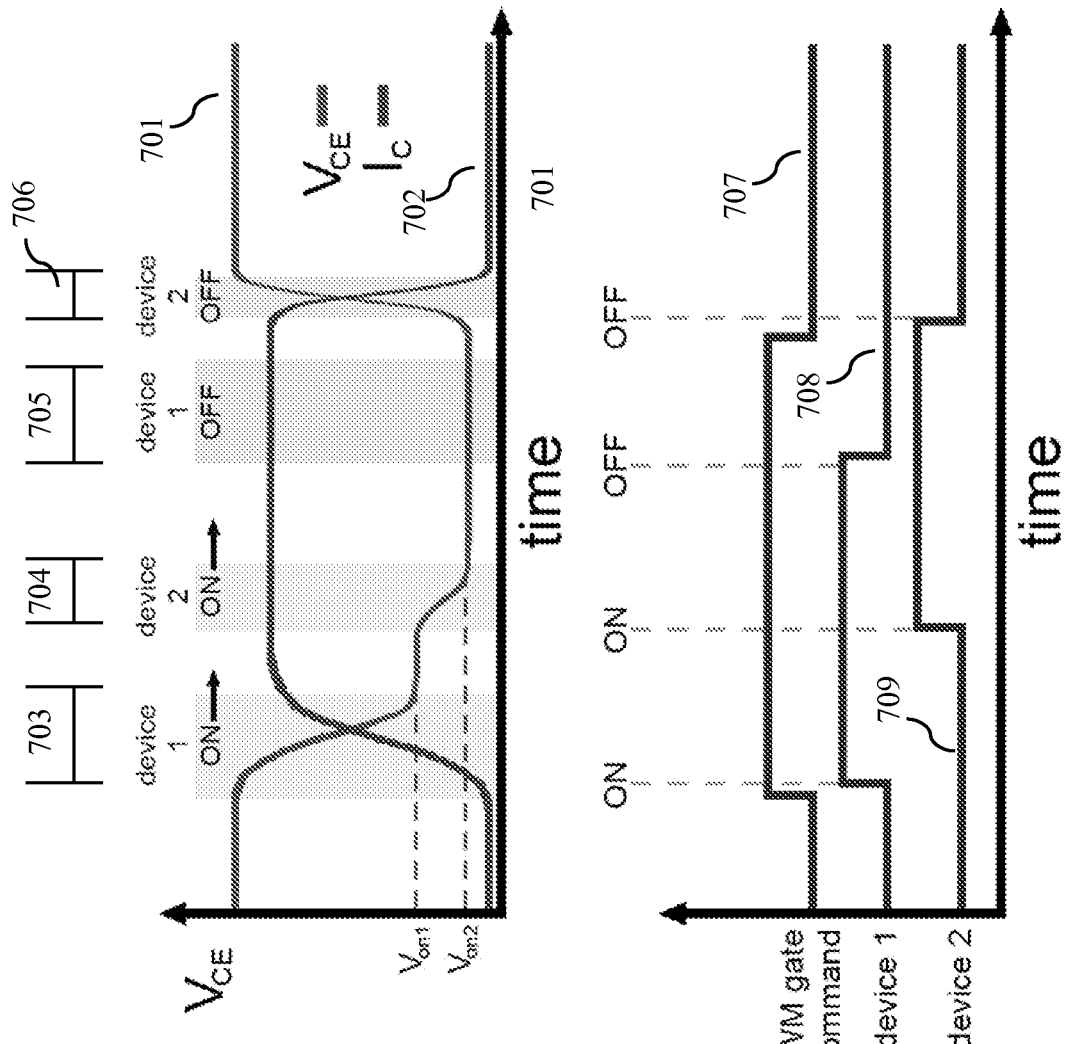
FIG. 7A is a graph showing voltage and current characteristics of the IGBT/electromechanical switching element shown in FIG. 6 (in which the electromechanical switch has an electrically conductive membrane, and the electrically conductive membrane is a graphene membrane).
FIG. 7B is a graph that depicts the commands and outputs of the controller of the IGBT/electromechanical hybrid switching element shown in FIG. 6 to generate the voltage and current characteristics shown in FIG. 7A.

FIG. 7A shows the voltage and current characteristics in curves 701 and 702, respectively, of the switching element 600 depicted in FIG. 6 (having a graphene membrane as the electrically conductive membrane in electrically conductive membrane switch 604). FIG. 7B shows the PWM gate logic command 707 (from PWM gate 607) received by the controller 605 and the on/off output signals 708 and 709 sent to IGBT switch 603 (device 1) and graphene membrane switch 604 (device 2) to generate the voltage and current characteristics shown in FIG. 7A.

In this operation of the switching element 600, the first switch to be switched on (during device 1 turn-on stage 703) is an IGBT switch 603 that would lower the voltage to the point where the low resistance type of graphene membrane switch 604 can be turned on (during device 2 turn-on stage 704). Once the graphene membrane switch 604 is turned on, the IGBT switch 603 can be turned off (during device 1 turn-off stage 705), and the graphene membrane switch 604 is then be used to switch off the current (during device 2 turn-off stage 706). This method takes advantage of the low conduction losses of the graphene membrane switch 604 and eliminates the turn-off losses of the IGBT switch 603, because there is no current tail.

Figure 8:
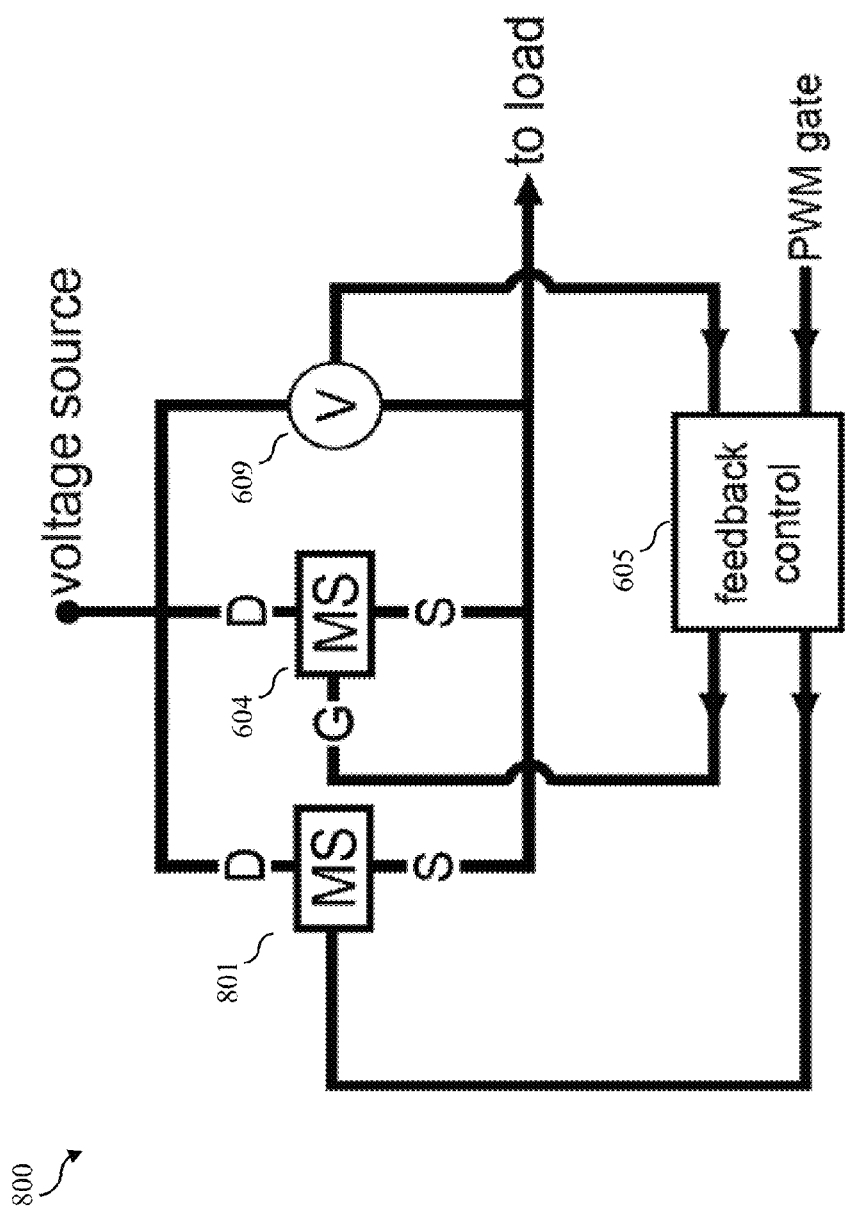
FIG. 8 depicts an embodiment of the present invention that utilizes a parallel electromechanical switch configuration.

FIG. 8 depicts another embodiment of the present invention that utilizes a parallel electrically conductive membrane switch configuration. As compared to the embodiment of FIG. 6, switching element 800 utilizes a second electromechanical switch (electrically conductive membrane switch 801) in place of the IGBT switch 603.

In switching element 800 (having graphene membrane switches for electrically conductive membrane switches 604 and 801), a high switching voltage type of graphene switch (graphene switch 801) can be turned on during device 1 turn-on stage 703 to reduce the voltage and then turn on a low-resistance graphene switch (graphene switch 604) during the device 2 turn-on stage 704 for the conduction phase of the switching cycle. The high switching voltage type of graphene switch 801 and the low-resistance graphene membrane switch 604 can be turned off during device 1 turn-off stage 705 and device 2 turn-off stage 706, respectively. This configuration thus eliminates the IGBT (and the diode, with the appropriate feedback control scheme) altogether.

Figure 9:
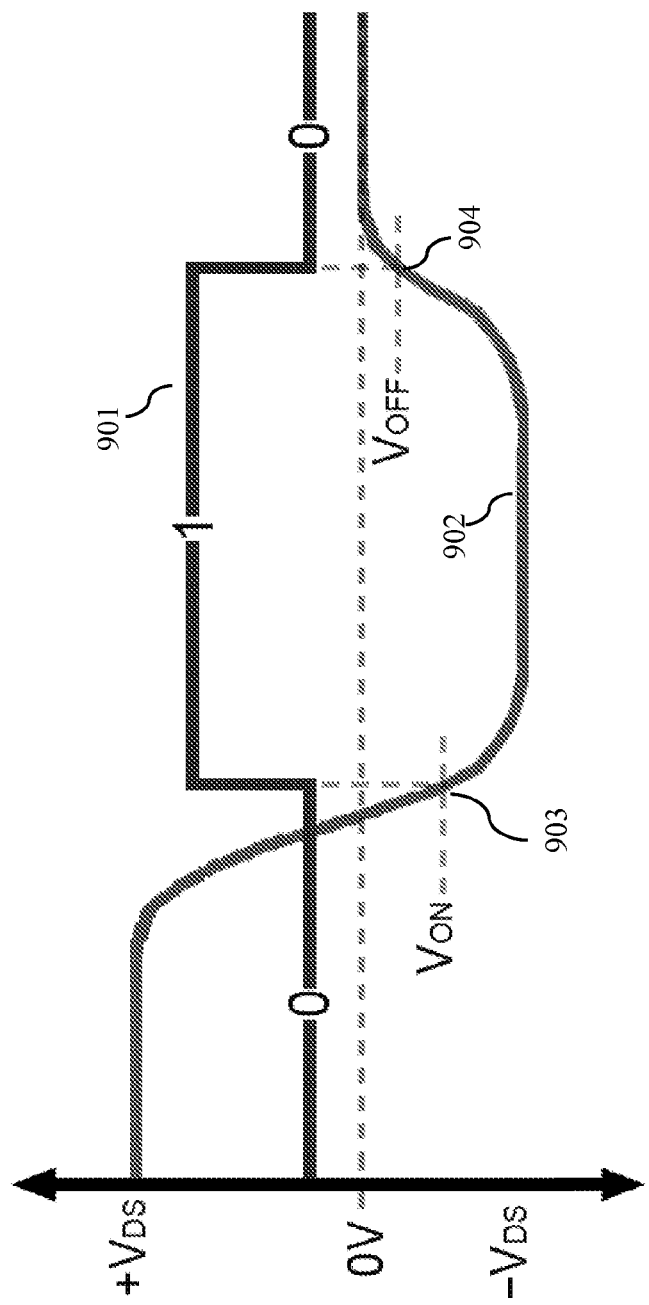
FIG. 9 is a graph that depicts characteristics of voltage switch logic and analog voltage that can be utilized so that the use of an electrically conductive membrane can eliminate the need for a diode in embodiments of the present invention.

FIG. 9 is a graph that depicts characteristics of voltage switch logic and analog voltage that can be utilized so that the use of an electrically conductive membrane can eliminate the need for a diode in embodiments of the present invention (such as in the switching element shown in FIG. 8). Curve 901 and curve 902 represent the electrically conductive membrane switch logic and the analog voltage, respectively.

To accomplish the elimination of the IGBT and diode, the controller 605 (in switching element 800) uses the voltage feedback (from voltage feedback sensor 607) to detect when the switching element 800 is reversed biased (e.g., when the voltage is negative), in which case the diode of a IGBT switch (such as the IGBT switch 603 shown in FIG. 6) would be forward biased. When the voltage goes negative beyond a predetermined threshold ($V_{on}$, 903 in FIG. 9) the controller 605 automatically turns on the graphene membrane switch 801. When the circuit conditions evolve such that the negative voltage returns across a second predetermined threshold ($V_{off}$, 904 in FIG. 9) the controller 605 automatically turns off the graphene membrane switch 801, thus mimicking the behavior of the diode utilized in the IGBT switch 603 in switching element 600 shown in FIG. 6 (which has an IGBT/electrically conductive membrane hybrid switch configuration). This control logic is thus combined with the PWM gate timing logic described above to allow the graphene membrane switch 801 to replace both the IGBT and diode of the IGBT switch 603 in switching element 600 shown in FIG. 6).

A number of embodiments of the invention have been described. Nevertheless, it will be understood that various modifications may be made without departing from the spirit and scope of the invention. Accordingly, other embodiments are within the scope of the following claims.

For instance, while the specification discusses using an electromechanical switch (such as an electrically conductive membrane switch) in lieu of, or in addition to, an IGBT switch, the electromechanical switch (such as an electrically conductive membrane switch) can be used in lieu of, or in addition to, other types of switches in switching elements. For example, a metal-oxide-semiconductor field-effect transistor (MOSFET) is another type of transistor that is used as a switch. An electromechanical switch (such as an electrically conductive membrane switch) can be used in lieu of, or in addition to, a MOSFET switch in a switching element.

Also, for example, in addition to silicon-based switches, silicon-carbide-based (SiC-based) switches and gallium-nitride-based (GaN-based) switches are further types of switches that electromechanical switch (such as an electrically conductive membrane switches) can be used in lieu of, or in addition to, in switching elements. Indeed, it is believed that SiC-based and GaN-based switches may have potential advantages over Si-based switches (such as for IGBT switches), which would render SiC-based and GaN-based switches better, in certain circumstances, to be used as the "turn on" switch (i.e., "device 1") as discussed above with respect to the embodiment of the present invention depicted in FIG. 6.

Further, for instance, while the switching elements discussed herein are directed to those having two switches, the switching element can also be made to have three or more switches. Such additional switches in the switching elements can also be controlled by the controller, such as in stages, and by implementing multiple timing intervals between the turning on and off of the various switches in the switching element.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A switching element comprising:
   (a) a first switch;
   (b) a second switch, wherein the second switch is an electromechanical switch connected electrically in parallel with the first switch; and
   (c) a controller, wherein
      (i) the controller is operatively connected to the first switch and the second switch,
      (ii) the controller is operable for turning on the first switch at a first voltage,
      (iii) the controller is operable for turning on the second switch at a second voltage after a first time delay such that the second switch is turned on after the first switch is turned on by the controller,
      (iv) the second voltage is less than the first voltage,
      (v) the controller is operable for turning off the first switch after a second time delay such that the first switch is turned off after the second switch is turned on by the controller, and
      (vi) the controller is operable for turning off the second switch after a third time delay such that the second switch is turned off after the first switch is turned off by the controller.

2. The switching element of claim 1, wherein the second switch is an electrically conductive membrane switch.

3. The switching element of claim 2, wherein the controller is operable for synchronizing the operation of the first switch and the second switch.

4. The switching element of claim 2, wherein the second switch is an electrically conductive membrane switch having an electrically conductive membrane that is atomically thin.

5. The switching element of claim 2, wherein the electrically conductive membrane comprises graphene.

6. The switching element of claim 2, wherein the first switch is a semiconductor switch.

7. The switching element of claim 2, wherein the first switch is an electrically conductive membrane switch.

8. The switching element of claim 7, wherein the first switch is an electrically conductive membrane switch comprising graphene.

9. The switching element of claim 2, wherein the second switch is a graphene membrane switch.

10. The switching element of claim 9, wherein the first switch is a graphene membrane switch.

11. The switching element of claim 1 further comprising a third switch, wherein
    (a) the third switch is connected electrically with the first switch and the second switch;
    (b) the first switch, the second switch, and the third switch are connected in parallel; and
    (c) the controller is operatively connected to the third switch such that the controller is operable for controlling the third switch.

12. The switching element of claim 11, wherein
    (a) the controller is operable for turning on the third switch after the first switch and the second switch are turned on by the controller; and
    (b) the controller is operable for turning off the third switch after the first switch and the second switch are turned off by the controller.

13. The switching element of claim 1, wherein the second switch is a nano electromechanical switch.

14. A switching element comprising:
    (a) a first switch;
    (b) a second switch, wherein the second switch is an electrically conductive membrane switch connected electrically in parallel with the first switch; and
    (c) a controller operatively connected to the first switch and the second switch such that the controller is operable for controlling the first switch and the second switch, wherein
       (ii) the controller is operable for turning on the first switch at a first voltage,
       (iii) the controller is operable for turning on the second switch at a second voltage after a first time delay such that the second switch is turned on after the first switch is turned on by the controller, and
       (iv) the second voltage is less than the first voltage
       (v) the controller is operable for turning off the first switch after a second time delay such that the first switch is turned off after the second switch is turned on by the controller, and
       (vi) the controller is operable for turning off the second switch after a third time delay such that the second switch is turned off after the first switch is turned off by the controller.

15. The switching element of claim 14, wherein the electrically conductive membrane switch comprises a membrane switch selected from the group consisting of graphene membrane switches, graphene oxide membrane switches, and graphene/graphene oxide membrane switches.

16. The switching element of claim 14, wherein the electrically conductive membrane switch comprises a graphene membrane.

17. A switching power converter comprising:
(a) a first switching element;
(b) second switching element, wherein the second switching element comprises
  (i) an electromechanical switch,
  (ii) a parallel switch connected electrically in parallel to the electromechanical switch, and
  (iii) a controller, wherein
    (1) the controller is operable for turning on the parallel switch at a first voltage,
    (2) the controller is operable for turning on the electromechanical switch at a second voltage after a first time delay such that the electromechanical switch is turned on after the parallel switch is turned on by the controller,
    (3) the controller is operable for turning off the parallel switch after a second time delay such that the parallel switch is turned off after the electromechanical switch is turned on by the controller; and
    (4) the controller is operable for turning off the electromechanical switch after a third time delay such that the electromechanical switch is turned off after the parallel switch is turned off by the controller, and
    (5) the second voltage is less than the first voltage;
(c) a power source;
(d) a filter; and
(e) a load, wherein the first switching element, the second switching element, the power source, the filter, and the load are operatively connected for switching power converting operations.

18. The switching power converter of claim 17, wherein the electromechanical switch comprises an electrically conductive membrane switch.

19. The switching power converter of claim 18, wherein the electromechanical switch is a graphene membrane switch.

20. The switching power converter of claim 19, wherein the parallel switch is a different graphene membrane switch.

21. The switching power convertor of claim 18, wherein the parallel switch comprises a different electrically conductive membrane switch.

22. The switching power converter of claim 18, wherein the parallel switch comprises a semiconductor switch.

23. The switching power converter of claim 17, wherein the switching power converter is operable for power conversion selected from the group consisting of (i) converting AC power to DC power, (ii) converting DC power to AC power, (iii) converting one DC voltage level to another DC voltage level, and (iv) a combination thereof.

24. The switching power converter of claim 17, wherein the controller is operable for cycling the first switching element and the second switching element via pulse width modulation.

25. A method of operating a switching element comprising the steps of:
(a) turning on a first switch at a first voltage;
(b) turning on a second switch at a second voltage after a first time delay, wherein
  (i) the second switch is an electromechanical switch,
  (ii) the second switch is turned on after the first switch is turned on, and
  (iii) the second voltage is less than the first voltage;
(c) turning off said first switch after a second time delay, wherein the first switch is turned off after the second switch is turned on; and
(d) turning off the second switch after a third time delay, wherein the second switch is turned off after the first switch is turned off.

26. The method of claim 25, wherein the electromechanical switch is an electrically conductive membrane switch.

27. The method of claim 26, wherein the electromechanical switch is an electrically conductive membrane switch having an electrically conductive membrane that is atomically thin.

28. The method of claim 26, wherein the electrically conductive membrane switch comprises graphene.

29. The method of claim 26, wherein the first switch comprises a semiconductor material.

30. The method of claim 26, wherein the first switch is a different electrically conductive membrane switch.

31. The method of claim 26, wherein the first switch is a different electrically conductive membrane switch comprising graphene.

32. The method of claim 25, wherein the first switch is a different electromechanical switch.

33. The method of claim 25, wherein the second switch is a graphene membrane switch.

34. The switching element of claim 33, wherein the first switch is a graphene membrane switch.

35. A method of operating a switching power convertor comprising the steps of:
(a) operating a first switching element;
(b) operating a second switching element, comprising
  (i) turning on a first switch at a first voltage;
  (ii) turning on a second switch at a second voltage after a first time delay, wherein
    (1) the second switch is connected electrically in parallel to the first switch,
    (2) the second switch comprises an electromechanical switch,
    (3) the second switch is turned on after the first switch is turned on,
    (4) the second voltage is less than the first voltage, and
    (5) the switching power converter converts power selected from the group consisting of (I) converting AC power to DC power, (II) converting DC power to AC power, (III) converting one DC voltage level to another DC voltage level, and (IV) a combination thereof;
  (iii) turning off said first switch after a second time delay, wherein the first switch is turned off after the second switch is turned on; and
  (iv) turning off the second switch after a third time delay, wherein the second switch is turned off after the first switch is turned off.

36. The method of claim 35, wherein the second switch comprises an electrically conductive membrane switch.

37. The method of claim 36, wherein the electronically conductive membrane switch is a graphene membrane switch.

38. The method of claim 36, wherein the second switching element further comprises a controller that controls the operation of the electrically conductive membrane switch and the first switch.

39. The method of claim 36, wherein the first switch comprises a different electrically conductive membrane switch.

40. The method of claim 36, wherein the second switch is a graphene membrane switch.

41. The method of claim 40, wherein the first switch is a different graphene membrane switch.

42. The method of claim 36, wherein the first switch is a semiconductor switch.

43. The method of claim 36 further comprising cycling the first switching element and the second switching element via pulse width modulation.

44. The method of claim 35, wherein the first switch comprises a different electromechanical switch.

* * * * *